(12) United States Patent  
Breuer (10) Patent No.: US 9,349,566 B1  
(45) Date of Patent: May 24, 2016

(54) CHARGED PARTICLE BEAM DEVICE, BEAM DEFLECTOR DEVICE AND METHODS OF OPERATING THEREOF

(71) Applicant: ICT Integrated Circuit Testing Gesellschaft für Halbleiterprüftechnik mbH, Heimstetten (DE)

(72) Inventor: John Breuer, München (DE)

(73) Assignee: ICT INTEGRATED CIRCUIT TESTING GESELLSCHAFT FÜR HALBLEITERPRÜFTECHNIK MBH, Heimstetten (DE)

( * ) Notice: Subject to any disclaimer, the term of this patent is extended or adjusted under 35 U.S.C. 154(b) by 0 days.

(21) Appl. No.: 14/828,352

(22) Filed: Aug. 17, 2015

(51) Int. Cl.  
*H01J 37/145* (2006.01)  
*H01J 37/147* (2006.01)  
*H01J 37/28* (2006.01)

(52) U.S. Cl.  
CPC ........... *H01J 37/145* (2013.01); *H01J 37/1474* (2013.01); *H01J 37/28* (2013.01); *H01J 2237/10* (2013.01); *H01J 2237/152* (2013.01)

(58) Field of Classification Search  
USPC ....................................... 250/396 R, 396 ML  
See application file for complete search history.

(56) References Cited

U.S. PATENT DOCUMENTS

| | | | | |
|---|---|---|---|---|
| 5,319,207 A | * | 6/1994 | Rose ...................... | H01J 37/153 250/396 R |
| 8,274,046 B1 | * | 9/2012 | Ren ......................... | H01J 37/05 250/305 |

\* cited by examiner

*Primary Examiner* — Kiet T Nguyen  
(74) *Attorney, Agent, or Firm* — Kilpatrick Townsend & Stockton LLP (57) ABSTRACT

A charged particle beam device (100) is described. The charged particle beam device includes a beam source (150) for generating a charged particle beam (101); a lens device (160); and a beam deflector device (110) for deflecting the charged particle beam with respect to a direction of incidence (A). The beam deflector device includes: a first deflector (112) providing a first magnetic deflection field ($B_1$) for deflecting the charged particle beam by a first half of a deflection angle ($\alpha$); a second deflector (114) providing a second magnetic deflection field ($B_2$) for deflecting the charged particle beam by a second half of the deflection angle ($\alpha$); and a rotation-free lens arranged between the first deflector (112) and the second deflector (114) for at least partially compensating for a dispersion introduced by at least one of the first deflector and the second deflector, wherein the lens device (160) is configured for creating a crossover (X) of the charged particle beam at the position of the rotation-free lens.

20 Claims, 5 Drawing Sheets

CHARGED PARTICLE BEAM DEVICE, BEAM DEFLECTOR DEVICE AND METHODS OF OPERATING THEREOF

TECHNICAL FIELD

Embodiments of the present invention relate to a charged particle beam device, for example, for inspection system applications, testing system applications, defect review or critical dimensioning applications, surface imaging applications (SEM) or the like, to a beam deflector device and to methods of operating thereof. Embodiments of the present invention particularly relate to a beam deflector device for deflecting a charged particle beam, e.g. an electron beam, by a deflection angle in a charged particle beam device, as well as to a charged particle beam device with a beam deflector device. Further embodiments relate to methods of operating a charged particle device, in particular for deflecting a charged particle beam with respect to a direction of incidence.

BACKGROUND

Semiconductor technologies have created a high demand for structuring and probing specimen in the nanometer or even in the sub-nanometer scale. Micrometer and nanometer scale process control, inspection or structuring, is often done with charged particle beams, e.g. electron beams, which are generated, deflected and focused in charged particle beam devices, such as electron microscopes or electron beam pattern generators. For inspection purposes, charged particle beams offer superior spatial resolution compared to, e.g. photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance in case of an SEM, the primary electron (PE) beam generates particles like secondary electrons (SE) and/or backscattered electrons (BSE) that can be used to image and analyze a specimen.

For high resolution imaging devices based on electron optics systems reduced aberrations and/or an improved aberration correction is one aspect to be considered. The provision of charged particle beam devices having aberration correction is beneficial. In particular, beam shaping and beam steering elements in the beam propagation path, e.g. beam deflectors, beam separators etc., may cause additional aberrations or dispersion which should be reduced or corrected in order to be able to provide for an inspection device with a high spatial resolution in the sub-nanometer range.

SEM columns are limited in their achievable resolution due to the diffraction limit, chromatic and/or spherical aberrations of the objective lens and/or other optical components included in the SEM column. In particular at low landing energies of 5 keV or below, in particular 500 eV or below, chromatic aberration is the limitation. Further, spatial dispersion of charged particles within the energy width of the charged particle beam as well as spherical aberrations may prevent a significant improvement of resolution.

SUMMARY

In light of the above, according to the independent claims, a charged particle beam device, a beam deflector device, and methods of operating a charged particle beam device are provided. Further aspects, advantages, and features of the present invention are apparent from the dependent claims, the description, and the accompanying drawings.

According to embodiments described herein, a charged particle beam device is provided. The charged particle beam device includes a beam source for generating a charged particle beam, a lens device, and a beam deflector device for deflecting the charged particle beam with respect to a direction of incidence. The beam deflector device includes a first deflector providing a first magnetic deflection field for deflecting the charged particle beam by a first half of a deflection angle; a second deflector providing a second magnetic deflection field for deflecting the charged particle beam by a second half of the deflection angle; and a rotation-free lens, particularly an electrostatic lens, arranged between the first deflector and the second deflector for at least partially compensating for a dispersion of the charged particle beam introduced by at least one of the first deflector and the second deflector, wherein the lens device and the first deflector are configured for creating a crossover of the charged particle beam at the position of the rotation-free lens.

According to a further aspect, a beam deflector device for deflecting a charged particle beam with respect to a direction of incidence is provided. The beam deflector device includes a first deflector providing a first magnetic deflection field for deflecting the charged particle beam by a first half of a deflection angle; a second deflector providing a second magnetic deflection field for deflecting the charged particle beam by a second half of the deflection angle; and a rotation-free lens, particularly an electrostatic lens, to be arranged at a position of a crossover of the charged particle beam between the first deflector and the second deflector for at least partially compensating for a dispersion of the charged particle beam introduced by at least one of the first deflector and the second deflector. The beam deflector device may be utilized in a charged particle beam device, e.g. a SEM.

According to a further aspect, a method of operating a charged particle beam device is provided. The method includes generating a charged particle beam; deflecting the charged particle beam with a first magnetic deflection field by a first half of a deflection angle; deflecting the charged particle beam with a second magnetic deflection field by a second half of the deflection angle; focusing the charged particle beam to generate a beam crossover between the first magnetic deflection field and the second magnetic deflection field; and exciting a rotation-free lens, particularly an electrostatic lens, arranged at a position of the beam crossover to at least partially compensate for a spatial dispersion of the charged particle beam.

According to a further aspect, a method of aligning a beam deflector device is provided. The method includes focusing a charged particle beam to generate a beam crossover at a first distance of a switched-off first magnetic deflection field; switching on the first magnetic deflection field to deflect the charged particle beam by a first half of a deflection angle and to shift the beam crossover to a second distance of the first magnetic deflection field; exciting a second magnetic deflection field to deflect the charged particle beam by a second half of the deflection angle; exciting a rotation-free lens, particularly an electrostatic lens, arranged at a position of the beam crossover to at least partially compensate for a dispersion of the charged particle beam.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments according to the invention are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Embodiments described herein relate to a charged particle beam device which includes a beam source adapted for generating a charged particle beam, e.g. an electron beam, and a lens device for shaping the generated charged particle beam so that the charged particle beam propagates along an optical axis. The lens device may be a condenser lens system (CLS) adapted for collimating or focusing the charged particle beam with a predetermined beam width and beam convergence. The beam source can be designed as a high brightness, low energy width beam source selected from the group consisting of a thermal field emitter TFE source, a cold field emitter CFE source, or carbon nanotube source. By operating the beam source in combination with the lens device, a charged particle beam, e.g. a beam of primary electrons PE can be emitted and directed towards further beam optics along a direction of incidence A.

Before a charged particle beam is directed to a specimen to be inspected or processed, e.g. a semiconductor wafer, a mask, a workpiece etc., the charged particle beam may pass through one or more (electron-)optical elements arranged along a charged particle beam propagation path. According to embodiments described herein, the charged particle beam may be deflected towards a beam corrector device configured for compensating spherical and/or chromatic aberrations, and the compensated charged particle beam may then be deflected towards a beam separator adapted for directing the compensated charged particle beam towards an objective lens. The objective lens may be adapted for focusing the compensated charged particle beam onto the specimen, where signal particles, such as signal electrons, may originate from interaction with the specimen. The signal electrons may then again be deflected towards a detector assembly.

Therefore, charged particle beam devices as described above, e.g. scanning electron microscopes, may comprise one or more beam deflector devices for deflecting the charged particle beam by a deflection angle with respect to a direction of incidence. Typically, beam deflector devices may include magnetic and/or electrostatic deflection fields which allow a substantial change of direction of the optical axis with respect to a direction of incidence. The deflection angle may be understood as the angle between the optical axis upstream from the beam deflector device (direction of incidence) and the optical axis downstream from the deflector device (beam exit direction). For example, a beam deflector device may deflect the charged particle beam by a deflection angle between 70° and 110°, as opposed to deflection fields which are used for aligning an electron optical column with a substantially straight optical axis, where the direction of the optical axis is only changed by a few degrees or even only a few mrad.

Whereas deflection fields usable for beam alignment or to compensate for mechanical alignment errors may affect the beam quality in a less significant way, beam deflector devices with deflection angles of more than 20°, in particular beam deflectors with deflection angles of more than 70°, may introduce more significant distortions. For example, a magnetic deflector may have a focusing effect on a charged particle beam in only one plane, which may cause an astigmatism of the charged particle beam. Further, the deflection angle of a magnetic deflector may be dependent on particle energy, which may cause a spatial dispersion of the charged particle beam. Beam deflector devices providing beam deflection angles of more than 20° may also be referred to as beam benders.

The resolution attainable in a charged particle beam device may therefore be negatively affected by beam distortions caused by beam deflector devices arranged in the charged beam propagation path. According to embodiments described herein, the resolution limit may be improved by providing a charged particle beam device with one or more beam deflector devices which do not cause substantial beam aberrations or distortions. In particular, beam deflector devices for deflecting a charged particle beam by large deflection angles, e.g. 90°, that do not introduce substantial spatial dispersion into the optical system or that are even non-dispersive are provided. "Dispersion", as used herein, may mean a spatial dispersion of the charged particle beam, i.e. a deviation of charged particles from the optical axis depending on the particle energy. When the divergence angle of the charged particles of the charged particle beam depends on the particle energy, the resulting spatial dispersion may also be referred to as "angular" dispersion.

Figure 1:
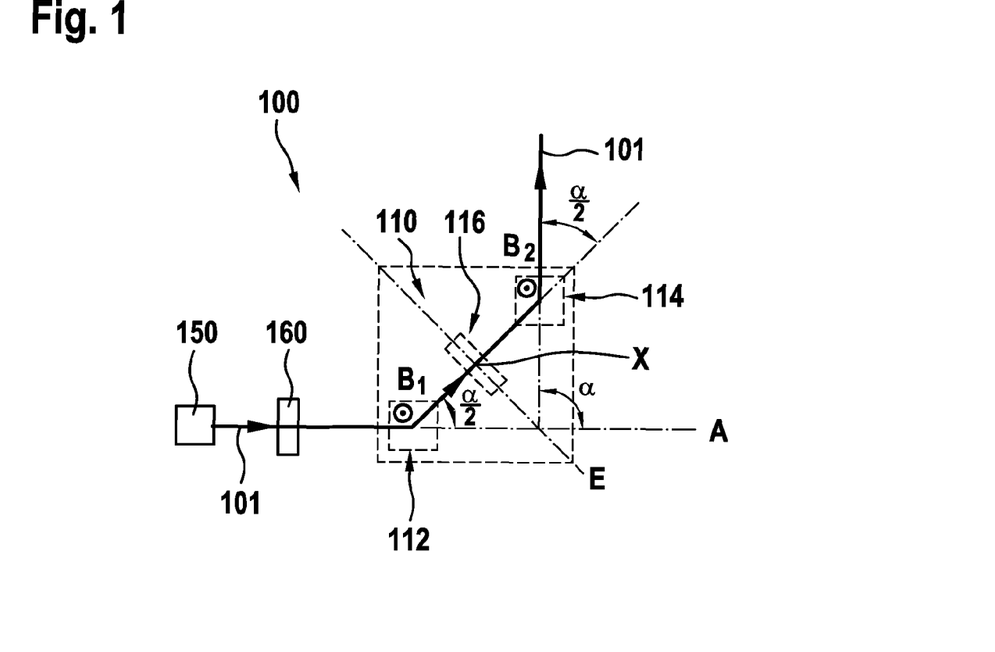
FIG. 1 shows a charged particle beam device according to embodiments described herein in a schematic view.

A charged particle beam device 100 with a beam deflector device 110 according to embodiments described herein is schematically shown in FIG. 1. The charged particle beam device 100 includes a beam source 150 for generating the charged particle beam, a lens device 160, and a beam deflector device 110 for deflecting the charged particle beam with respect to a direction of incidence A. The beam deflector device includes a first deflector 112 providing a first magnetic deflection field, e.g. a magnetic dipole field, for deflecting the charged particle beam by a first half of a deflection angle α, a second deflector 114 providing a second magnetic deflection field, e.g. a magnetic dipole field, for deflecting the charged particle beam by a second half of the deflection angle α, and a rotation-free lens, particularly an electrostatic lens 116, arranged between the first deflector and the second deflector for at least partially compensating for a dispersion introduced by at least one of the first deflector and the second deflector, wherein the lens device 160 and the first deflector are configured for creating a crossover X of the charged particle beam at the position of the rotation-free lens. In some embodiments, the electrostatic lens 116 may be a single electrostatic lens.

A rotation-free lens, e.g. an electrostatic lens, does not rotate the charged particle beam around the optical axis. On the other hand, a single magnetic lens would rotate the dispersion plane. However, also a rotation-free double-magnetic lens or other rotation-free lens devices may be used as the rotation-free lens in accordance with embodiments described herein.

At the position of a "crossover of a charged particle beam" as used herein, an image of the beam source may be formed. In other words, the electrostatic lens may be arranged in an image plane of the charged particle beam, where a real space image of the beam source is generated. For example, the beam source may be a field emitter source such as a thermal field emitter TFE source, a cold field emitter CFE source, a single atom tip or a carbon nanotube source, the image of which is formed at the position of the crossover. The beam source may exhibit a virtual source size smaller than 500 nm ("point source"), particularly smaller than 300 nm, and/or may provide a charged particle beam with a reduced brightness larger than $10^7$ A/(m²srV).

In some implementations, the electrostatic lens 116 and the crossover X of the charged particle beam may be arranged at a center position between the first deflector 112 and the second deflector 114. In other words, a length of a first portion of the charged particle beam propagation path between the first deflector and the electrostatic lens may correspond to a length of a second portion of the charged particle beam propagation path between the electrostatic lens and the second deflector. In particular, according to some embodiments which may be combined with other embodiments described herein, the first deflector and the second deflector may be arranged and/or may be configured symmetrically with respect to a first symmetry plane E which intersects through the electrostatic lens 116. The first symmetry plane E may intersect the center position between the first deflector and the second deflector perpendicular to the charged particle beam propagation path. A "symmetric" configuration of the first deflector and the second deflector as used herein may mean that the first magnetic field of the first deflector experienced by or acting upon the passing charged particle beam may be essentially symmetrical to the second magnetic field of the second deflector experienced by or acting upon the passing charged particle beam.

The beam deflector device 110 shown in FIG. 1 is configured for providing a total deflection angle of 90°. The charged particle beam 101 is focused by the lens device 160, which is arranged upstream from the first deflector 112, in such a way that a crossover is located downstream from the first deflector 112. The magnetic deflection field of the first deflector may deflect the charged particle beam 101 by 45° (e.g. counterclockwise) with respect to the direction of incidence A, and the magnetic deflection field of the second deflector 114 arranged downstream from the crossover X may deflect the charged particle beam by another 45° (e.g. counterclockwise). In other embodiments, the total deflection angle may be different, e.g. an angle between 20° and 110°, particularly an angle between 70° and 95°. In some embodiments, both deflections may be clockwise.

In some embodiments described herein, a first cross-sectional beam profile upstream from the beam deflector device may correspond to a second cross-sectional beam profile downstream from the beam deflector device. Particularly, both the first cross-sectional beam profile and the second cross-sectional beam profile may be round or circular.

Magnetic sector deflectors with a first deflector for deflecting the charged particle beam by a first half of the deflection angle and a second deflector for deflecting the charged particle beam by a second half of the deflection angle, with a beam crossover arranged between the first deflector and the second deflector may provide several advantages: First, as the first deflector and the second deflector are arranged and configured symmetrically with respect to the crossover X of the charged particle beam, a deflection deviation of the first deflector on a given paraxial ray may be inverse to a deflection deviation of the second deflector on the paraxial ray, so that the general beam shape may be kept constant. Second, stigmatic beam focusing may be achieved, as will be described below in further detail. Third, because the crossover is located at the position of the electrostatic lens, the shape of the charged particle beam is unaffected by the electrostatic lens. Therefore, the charged particle beam may symmetrically pass through the second deflector after having passed through the electrostatic lens, and may exit the beam deflector device with a cross-sectional shape corresponding to the original cross-sectional shape, particularly as a round beam bundle. On the other hand, the electrostatic lens may focus charged particles with an energy deviating from a nominal beam energy in such a way that during the pass of the second half of the beam deflector device accumulated dispersion from the first half of the beam deflector device can be cancelled.

Figure 2:
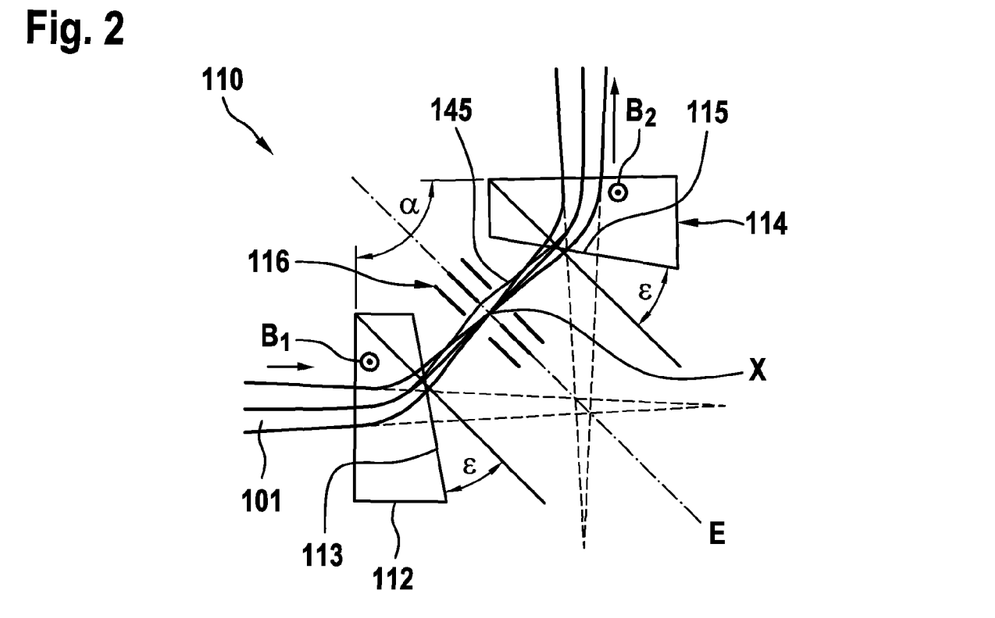
FIG. 2 shows a beam deflector device for a charged particle beam device according to embodiments described herein in a schematic view.

For example, charged particles with a particle energy smaller than a nominal particle energy of the charged particle beam ("low-energy particles 145") may be deflected by the first deflector 112 by an angle larger than the half of the deflection angle α. This may lead to an off-axis propagation of the deflected low-energy particles 145, as is schematically shown in FIG. 2. In particular, the low-energy particles do not propagate through the beam crossover X located at the position of the electrostatic lens 116 and are, therefore, steered back towards the optical axis by the electrostatic lens. As the electrostatic lens 116 may be arranged centrally between the first deflector and the second deflector, and as the first magnetic deflection field $B_1$ of the first deflector and the second magnetic deflection field $B_2$ of the second deflector may be arranged and configured in a symmetric way, spatial dispersion of the low-energy particles 145 may be substantially or completely cancelled after propagation through the second deflector. The same is true for high-energy particles.

In order to achieve a deflection of the charged particle beam by the full deflection angle α, the orientation of the first magnetic deflection field $B_1$ with respect to the optical axis may correspond to the orientation of the second magnetic deflection field $B_2$ with respect to the optical axis. A corresponding orientation may lead to two successive deflections by half of the deflection angle within one deflection plane in the same deflection direction (two clockwise deflections or two counterclockwise deflections).

A symmetric setup of the beam deflector device may lead to a charged particle beam propagation path which is symmetrical with respect to the first symmetry plane E, a cross sectional profile of the charged particle beam which is symmetrical with respect to the first symmetry plane in every sectional plane perpendicular to the charged particle beam propagation path in the beam deflector device 110, and/or to a cross sectional energy distribution of the charged particle beam which is symmetrical with respect to the first symmetry plane E in every sectional plane perpendicular to the charged particle beam propagation path in the beam deflector device 110.

FIG. 2 shows a beam deflector device 110 to be used in a charged particle beam device according to embodiments described herein. Similar to the arrangement shown in FIG. 1, the beam deflector device 110 includes a first deflector 112 configured for deflecting the charged particle beam by a first half of a deflection angle α, and a second deflector 114 configured for deflecting the charged particle beam by a second half of the deflection angle spaced-apart from the first deflector.

A magnetic deflection field may be generated by a magnetically excited pole-piece pair (also referred to as a "prism", as it deflects an incoming beam by a predetermined angle), which may be arranged symmetrically on both sides of a mid-plane that contains the curved optical axis. The plane, in which deflection occurs, may be referred to as the deflection plane, and the plane along the beam propagation path perpendicular to the deflection plane may be referred to as the off-plane. The magnetically excited pole pieces may have a predetermined shape in a plan view as shown in FIG. 2, the shape of which may define the edges of a deflection space between the pole piece pair. For example, the shape of the pole pieces in a plan view may be at least partially polygonal, e.g. rectangular, or at least partially rounded, e.g. oval. In embodiments, which may be combined with other embodiments described herein, the shape of the pole pieces in a plan view is trapezoidal. In particular, a beam entrance edge and/or a beam exit edge of the deflector may be straight, curved or inclined.

Such beam deflectors are based on the fact that charged particles travelling in a magnetic field are acted upon by a force in a direction perpendicular to both the direction of travel and the direction of the magnetic field. Magnetic beam deflectors may have a focusing effect on the charged particle beam at least in the deflection plane, but typically not equally in the off-plane, so that they may not focus stigmatically. Stigmatic focusing is characterized by the same beam crossover position in the deflection plane and in the off-plane.

The beam deflector device shown in FIG. 2 may both provide for a single position of the crossover X in the deflection plane and in the off-plane, and may at the same time reduce or remove a spatial dispersion caused by the first deflector and the second deflector, because the electrostatic lens 116 is arranged at the position of the crossover X.

According to some embodiments described herein, at least one of the beam entrance edge and the beam exit edge of the first deflector 112 may be shaped for reducing an astigmatism of the beam crossover X. For example, with the use of curved or inclined edges of the pole pieces of the first deflector, magnetic fringe fields may be generated at the beam entrance and/or at the beam exit for providing a focusing action also in the off-plane. These generated fringe fields between the tilted pole-piece edges may act as magnetic multipole components, e.g. as magnetic quadrupole components.

According to the embodiment shown in FIG. 2, the beam exit edge 113 of the first deflector is tilted by a tilting angle $\epsilon$ with respect to a first sectional plane perpendicularly intersecting the charged particle beam propagation path downstream from the first deflector. In other words, the edges of the pole pieces of the first deflector facing towards the first symmetry plane E may be tilted with respect to the symmetry plane E by the tilting angle $\epsilon$ at least in an area which is traversed by the charged particle beam. The tilting angle of the exit edge 113 of the first deflector may introduce a quadrupole field that, together with the deflecting magnetic (dipole) field may move the crossover X of the charged particle beam into the symmetry plane E, where the electrostatic lens 116 is positioned.

In some embodiments, the beam exit edge 113 may also be tilted with respect to a second sectional plane perpendicularly intersecting the charged particle beam propagation path upstream from the first deflector, particularly by a tilting angle of $((\alpha/2)-\epsilon)$. In other words, the beam exit edge 113 may be inclined with respect to the second sectional plane upstream from the first deflector, but with a smaller inclination angle than the first sectional plane downstream from the first deflector. For example, in case of a counterclockwise deflection of the charged particle beam by the first deflector 112, the beam exit edge 113 may be tilted counterclockwise with respect to the second sectional plane.

Without an inclination of the beam exit edge of the first deflector, the charged particle beam would be astigmatic, and it would not be possible to provide a focus of both the deflection-plane rays and the off-plane rays in the same focal point.

According to embodiments described herein, the tilting angle $\epsilon$ is larger than 1° and smaller than 80°, particularly larger than 5° and smaller than 45. The exact value of the tilting angle may depend on the deflection angle α, on the beam properties of the incident beam and on the position of the crossover X (i.e. the symmetry plane). For a deflection angle α of 90° (α/2=45°) the tilting angle may be about 35°.

In order to provide for a symmetric setup of the beam deflector device, also a beam entrance edge 115 of the second deflector 114 may be tilted by the tilting angle $\epsilon$ with respect to a sectional plane perpendicularly intersecting the charged particle beam propagation path downstream from the first deflector and upstream from the second deflector. In other words, the edges of the pole pieces of the second deflector 114 facing towards the first symmetry plane E may be tilted with respect to the symmetry plane E by the tilting angle $\epsilon$, at least in an area which is traversed by the charged particle beam. Thus, the beam exit edge 113 of the first deflector and the beam entrance edge 115 of the second deflector are symmetrical with respect to the symmetry plane E. A symmetrically configured quadrupole field component may be introduced by the tilted beam entrance edge 115 of the second deflector, so that an original cross-sectional shape of the charged particle beam may be restored while passing through the second deflector.

According to some embodiments described herein, the beam entrance edge of the first deflector may be perpendicular to the optical axis upstream from the first deflector, and the beam exit edge of the second deflector may be perpendicular to the optical axis downstream from the second deflector, so that the shape of a deflection space of the first deflector traversed by the charged particle beam is a mirror image of the shape of a deflection space of the second deflector traversed by the charged particle beam.

Alternatively or additionally, an astigmatism reduction device such as a multipole element (electric or magnetic) providing an additional magnetic field for reducing the astigmatism of the beam crossover X may be provided. The astigmatism reduction device may be arranged between the first deflector and the electrostatic lens. In order to provide for a symmetric setup, a corresponding multipole element may be provided between the electrostatic lens and the second deflector. However, an additional astigmatism reduction device may not be necessary, and a stigmatic charged particle beam may already be provided by the shape of the magnetic deflection fields of the first and second deflectors.

The crossover X being located centrally between the first deflector and the second deflector, where the electrostatic lens is arranged, the particles of the charged particle beam with nominal energy are unaffected by the electrostatic lens 116. It symmetrically passes through the second deflector, is deflected by another half of the deflection angle, and exits the beam deflector device with an original cross-sectional shape, e.g. as a round bundle. However, the electrostatic lens 116 focuses high- and low energy particles in such a way that the spatial dispersion is reduced or cancelled during the passing of the second deflector.

As is shown in FIG. 2, the charged particle beam 101 may enter the beam deflector device 110 converging slightly. The beam convergence may be provided by a lens device 160 arranged upstream from the beam deflector device. In some embodiments, the charged particle beam may enter the beam deflector device as a collimated charged particle beam or as a divergent charged particle beam. In this case, the focusing effect may be provided only by the first deflector. Both the lens device 160 arranged upstream from the beam deflector device and the first deflector may have a focusing effect on the charged particle beam 101, and the lens device and the first deflector may be configured such that, in combination, the focusing effects create the crossover X of the charged particle beam 101 at a center position between the first deflector and the second deflector, where the electrostatic lens is arranged.

When operating the beam deflector device shown in FIG. 2, the charged particle beam may first be aligned to pass stigmatically through the first deflector and the second deflector by adjusting the properties of the first magnetic deflection field and the second magnetic deflection field as well as the parameters of the charged particle beam entering the beam deflector device, e.g. adjusting the position of the crossover X. Afterwards, the dispersion can be reduced or cancelled by exciting the electrostatic lens 116.

A method of aligning the beam deflector device according to embodiments described herein may comprise: focusing the charged particle beam to generate a beam crossover at a first distance of the first deflector, wherein the first magnetic dipole field of the first deflector is switched off so that the charged particle beam passes through the first deflector without being deflected; switching on the first magnetic deflection field to deflect the charged particle beam by the first half of the deflection angle and to shift the beam crossover to a second distance of the first magnetic deflection field, where the electrostatic lens is arranged; exciting a second magnetic deflection field to deflect the charged particle beam by the second half of the deflection angle; and exciting the electrostatic lens arranged at the position of the beam crossover to at least partially compensate for a dispersion of the charged particle beam.

Figure 3:
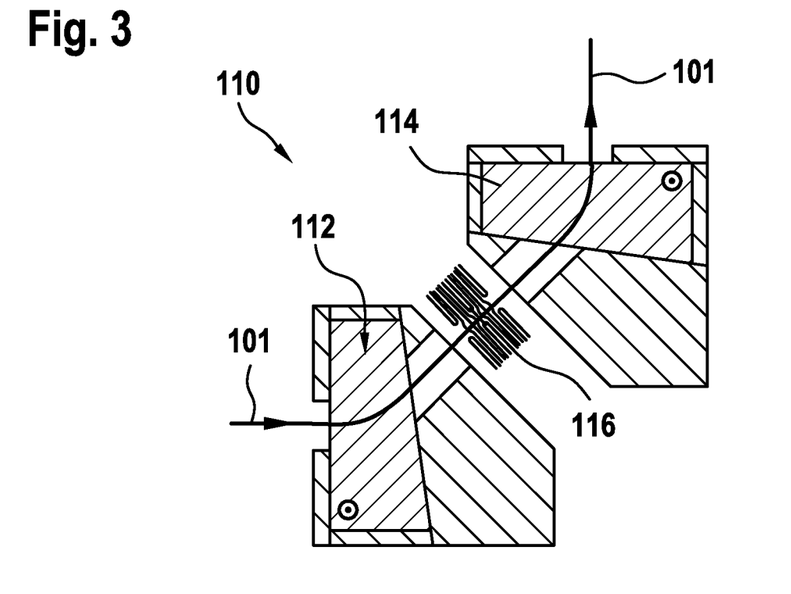
FIG. 3 shows a beam deflector device for a charged particle beam device according to embodiments described herein.

FIG. 3 shows a beam deflector device 110 according to embodiments described herein. The beam deflector device includes a first deflector 112 and a second deflector 114, each deflector including essentially trapezoidal pole piece pairs for providing the respective magnetic deflection fields. The electrostatic lens 116 is arranged in the middle between the first deflector and the second deflector, so that a symmetric setup is provided.

Figure 4:
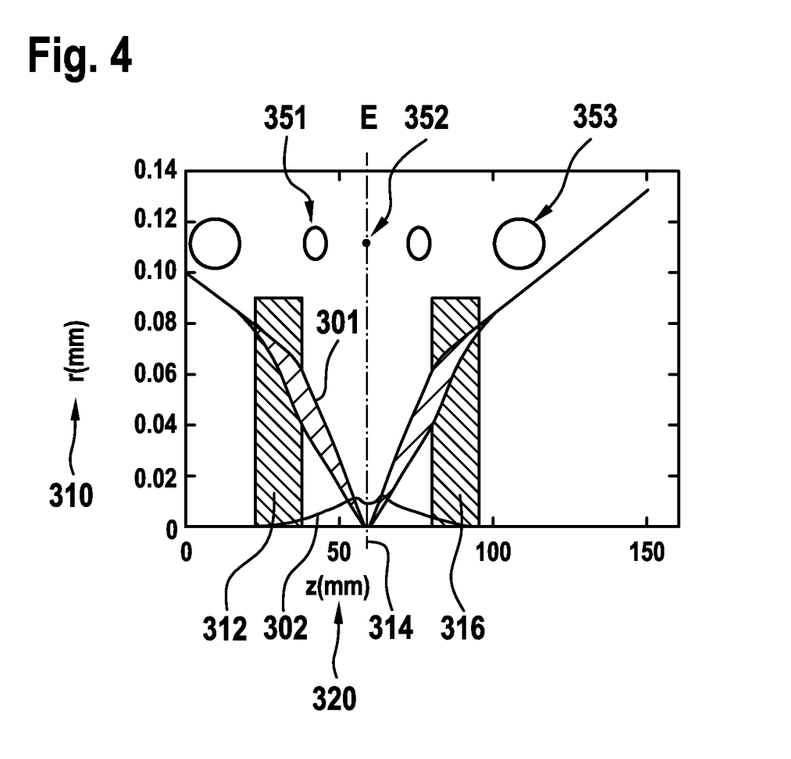
FIG. 4 is a graph showing ray tracing simulations of a charged particle beam propagating through the beam deflector device of FIG. 3.

Ray tracing simulations have been performed to show the effect of the beam deflector device 110 of FIG. 3 on a charged particle beam 101. Exemplary results of the ray tracing simulations are shown in FIG. 4. Paraxial rays 301 and a dispersive axial ray 302 are illustrated. Shown is the distance (310) of the paraxial rays 301 with nominal energy from the optical axis as a function of the passed distance (320). This corresponds to an illustration of the charged particle beam in a coordinate system that is moving along the charged particle beam propagation path. The first magnetic deflection field is denoted with reference numeral 312, the position of the electrostatic lens is denoted with reference numeral 314, and the second magnetic deflection field is denoted with reference numeral 316.

It can be seen that the initially round beam cross-section assumes an elliptic shape when passing through the first deflector (see reference numeral 351). However, due to the combination of the deflection-plane focusing by the dipole component of the first magnetic deflection field and the quadrupole components of the first magnetic deflection fields at the edge of the first deflector (tilted edge of pole piece), the charged particle beam is focused in a single point inside the electrostatic lens (see reference numeral 352). Due to the symmetry around the first symmetry plane E, the charged particle beam cross section undergoes a corresponding inverse development during the second deflection, so that the original round beam cross-sectional shape can be restored (see reference numeral 353).

The dispersive axial ray 302 (assumed to have 10 eV larger energy than the nominal particle energy of the paraxial rays 301) accumulates dispersion during the first deflection. However, the electrostatic lens is excited in such a way that the dispersion is cancelled during the pass through the second half of the beam deflector device. This can be either accomplished by using an accelerating lens or a decelerating lens. The effect of an accelerating lens is shown in FIG. 4.

Figure 5:
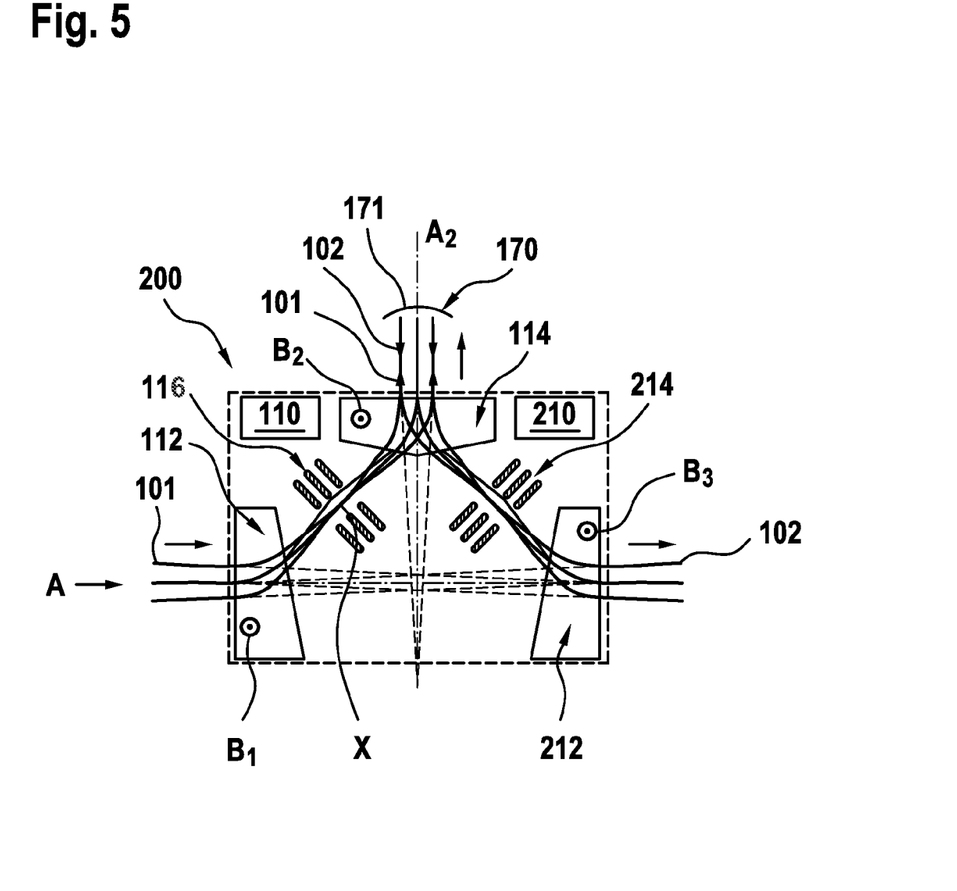
FIG. 5 shows a charged particle beam device according to embodiments described herein in a schematic view.

FIG. 5 shows a charged particle beam device 200 according to embodiments described herein. The charged particle beam device 200 may include a beam deflector device 110 in accordance with any of the above described embodiments, e.g. a beam deflector device 110 as shown in FIG. 2, so that reference can be made to the above explanations, which are not repeated here. The charged particle beam device may include a second beam deflector device 210 located downstream from the beam deflector device 110. In some embodiments, the second beam deflector device 210 may include some or all of the features of the beam deflector device 110, e.g. the beam deflector device 110 shown in FIG. 2, so that reference can be made to the above explanation, which are not repeated here.

The charged particle beam device 200 may include a beam direction reversal device 170 for sending back at least part of the charged particle beam 101 towards the second deflector 114 as a compensated charged particle beam 102, wherein the second deflector may be configured for deflecting the reflected compensated charged particle beam 102 by a second deflection angle. In other words, the reflected compensated charged particle 102 passes a second time through the second deflector 114 in a reverse direction. The second deflection angle may correspond to half the deflection angle α. In particular, the second deflection angle may be 45°.

As is shown in FIG. 5, at least a part of the second deflector of the beam deflector device 110 may act as at least a part of a first deflector of the second beam deflector device 210.

As the compensated charged particle beam 102 traverses the second magnetic deflection field in the reverse direction, the compensated charged particle beam 102 may be at least partially, e.g. halfway, deflected back towards the direction of incidence A.

According to some embodiments, which may be combined with other embodiments described herein, the beam direction reversal device 170 may include a mirror corrector 171 for correcting aberration of the charged particle beam, particularly for providing compensation of spherical and/or chromatic aberrations of the charged particle beam. The mirror corrector 171 may be adapted for correcting spherical and/or chromatic aberrations introduced by electron-optical elements in the charged particle beam propagation path upstream from and/or downstream from the mirror corrector 171. For example, the mirror corrector 171 may be adapted for correcting aberrations introduced by a lens device, e.g. a condenser lens system, located upstream from the beam deflector device, and/or it may be adapted for pre-compensating for aberrations introduced by an objective lens system for focusing the compensated charged particle beam onto a specimen, located downstream from the mirror corrector.

After having passed through the beam deflector device 110, the charged particle beam 101 may travel along an optical axis A2 of the mirror corrector 171. Spatial dispersion of the charged particle beam 101 would cause different optical axes depending on the charged particle energy. Differently "colored" particles would hit different areas of the mirror corrector 171 and would collect different amounts of compensating aberrations. This would compromise the final aberration compensation in the objective lens. However, according to embodiments described herein, a dispersion-minimized or a completely non-dispersive beam deflector device 110 is provided. Therefore, the charged particles will also return along the mirror axis A2 independent of the particle energy. In order to bring all particles of the charged particle beam exactly onto an optical axis of an objective lens, a passage through the second beam deflector device 210—which may partially correspond to the beam deflector device 110—located downstream from the mirror corrector 171 should also be dispersion-minimized or non-dispersive.

According to some implementations, the charged particle beam device may include a third deflector 212 providing a third magnetic deflection field $B_3$ for deflecting the compensated charged particle beam 102 by a third deflection angle, wherein the third deflection angle may correspond to the second deflection angle. Both the second deflection angle and the third deflection angle may correspond to half the deflection angle $\alpha$. In particular, the second deflection angle and the third deflection angle may be 45°. By passing through the second magnetic deflection field $B_2$ in a reverse direction and then through the third magnetic deflection field $B_3$, the compensated charged particle beam 102 may be deflected back to continue the propagation along the original propagation direction, i.e. the direction of incidence A. The orientation of the magnetic field lines of the first, second and third magnetic deflection fields acting on the charged particle beam with respect to the optical axis may be equal.

In some embodiments, the mirror corrector 171 may be configured to focus the charged particle beam 101 such that a second crossover of the compensated charged particle beam is generated at a center position of the beam propagation path between the second deflector and the third deflector.

The charged particle beam device 200 may include a second electrostatic lens 214 arranged at the center position between the second deflector and the third deflector for at least partially compensating for a dispersion introduced by at least one of the second deflector and the third deflector. In particular, the electrostatic lens 114 may be configured for compensating for a dispersion caused by the first magnetic deflection field $B_1$ and the first pass through the second magnetic deflection field $B_2$, and the second electrostatic lens 214 may be configured for compensating for a dispersion caused by the second pass through the second magnetic deflection field $B_2$ and the third magnetic deflection field $B_3$. In this case, a dispersion-free charged particle beam can be provided both at a position of the mirror corrector 171, and a dispersion-free compensated charged particle beam can be provided at a position downstream from the third deflector 212.

The second deflector may be shaped for reducing astigmatism of the compensated charged particle beam 102. For example, a beam exit edge for the compensated charged particle beam 102 of the second deflector may be tilted with respect to a sectional plane perpendicular to the charged particle beam propagation path between the second deflector and the third deflect by the tilting angle E. The third deflector may be shaped such that the beam propagation path of the compensated charged particle beam is symmetrical with respect to a second symmetry plane intersecting the second electrostatic lens perpendicular to the beam propagation path of the compensated charged particle beam.

Figure 6:
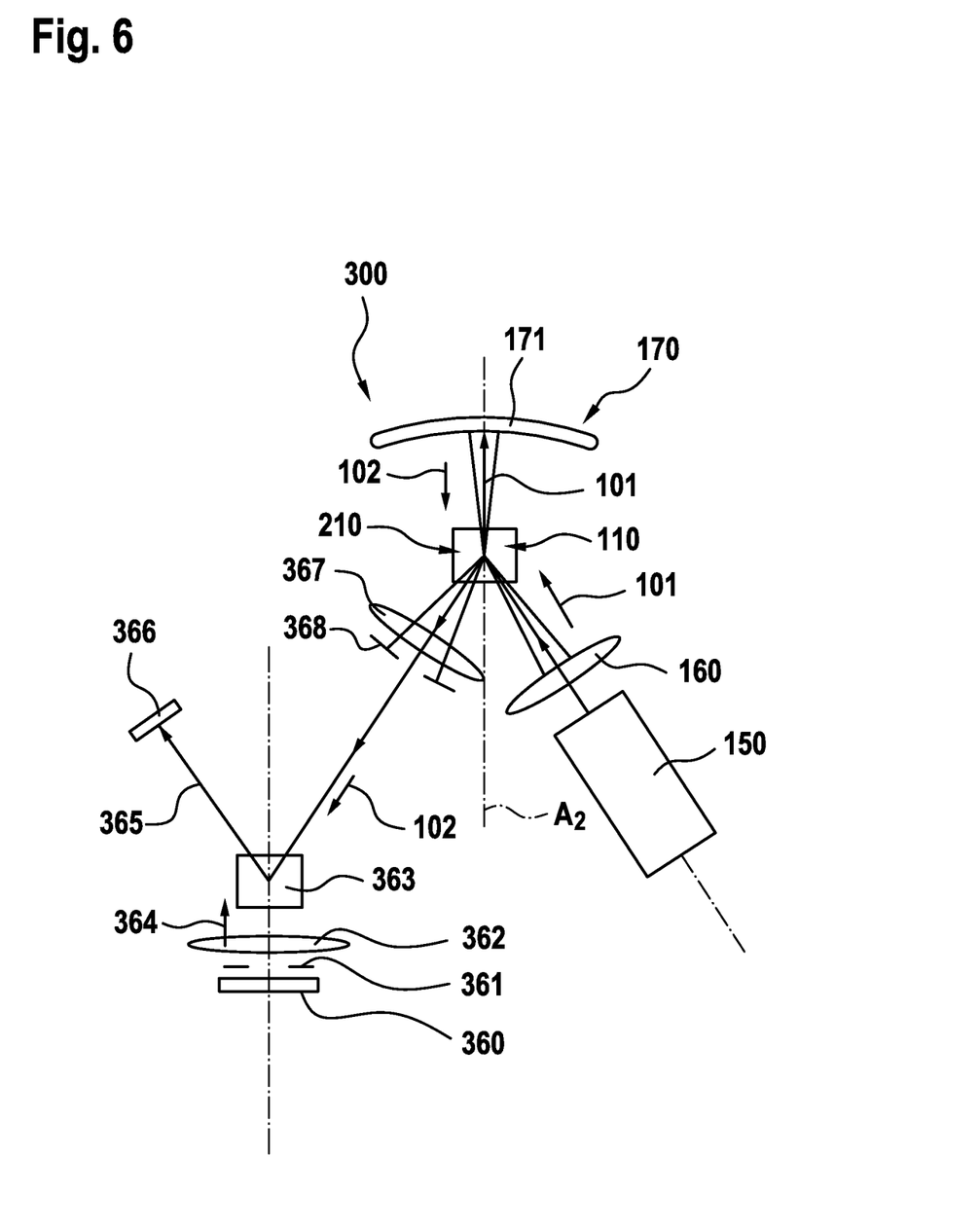
FIG. 6 shows a charged particle beam device according to embodiments described herein in a schematic view.

FIG. 6 shows a charged particle beam device 300 according to an embodiment in a schematic view. The charged particle beam device 300 includes a beam source 150 for generating a charged particle beam 101, and a lens device 160 for collimating or focusing the charged particle beam towards a beam deflector device 110.

In the beam deflector device 110, which may be a beam deflector device according to any of the above described embodiments, the charged particle beam is deflected by a deflection angle towards a mirror corrector 171. The mirror corrector 171 reflects the charged particle beam 101 as a compensated charged particle beam 102 back to the beam deflector device 110.

The second deflector of the beam deflector device 110 and a third deflector may act as a second beam deflector device 210, which may deflect the reflected compensated charged particle beam 102 by an angle with respect to a mirror axis A2, which angle may correspond to the deflection angle of the beam deflector device 110.

The mirror corrector 171 may be adapted for correcting spherical and/or chromatic aberrations caused by optical elements in the charged beam propagation path between the beam source 150 and a specimen 360 to be investigated. These optical elements can include at least one lens device 160, a transfer lens 367, a beam separator 363, an objective lens 362 and a control electrode 361, as shown in FIG. 6.

According to embodiments which can be combined with other embodiments described herein, an exit aperture 368 for the condenser lens 367 can be provided. The exit aperture 368 can be designed such that an opening angle of the compensated charged particle beam 102 towards the beam separator 363 can be defined. The beam propagation path can be flexibly adjusted in a simple manner.

According to further embodiments which can be combined with other embodiments described herein, the beam separator 363 can be selected from the group consisting of a magnetic deflection beam separator, a combined crossed electrostatic-magnetic field beam separator, a combination of two, three or four magnetic deflectors, a combination of a magnetic and an electrostatic deflector, a Wien filter, a dispersion free combined magnetic-electrostatic deflection unit, and any combinations thereof. In some implementations, the beam separator 363 may include a beam deflector device according to embodiments described herein.

The control electrode 361 can be arranged within the charged particle beam propagation path between the objective lens 362 and the specimen 360. The control electrode 361 can be adapted for adjusting, inter alia, the electrical field strength at the specimen 360 and hence the extraction of secondary particles from the surface. The landing energy at which the charged particles of the compensated charged particle beam 102 impinge on the specimen 360 is defined by the voltage difference between the beam source 150 and the specimen 360.

The compensated charged particle beam 102 which is reflected by the mirror corrector 171 and which already contains the aberration compensation information is used as the primary beam of charged particles for probing the specimen 360. When probing the specimen 360 using the compensated charged particle beam 102, for instance in the case of an SEM column, the primary particles generate secondary particles like secondary electrons SE and/or backscattered electrons that can be used to image and analyze the specimen 360. For analyzing the specimen 360, a secondary charged particle beam 365 originating from the specimen 360 is separated from the compensated charged particle beam 102 via the beam separator 363 and is directed towards a charged particle beam detection device 366. In the case of scanning electron microscopy SEM, secondary electrons SE and/or backscattered electrons emitted from the specimen 360 in emission direction 364 can pass through the objective lens 362 and can then be detected by the charged particle beam detection device 366.

The charged particle beam device 300 shown in FIG. 6 may be operated as follows in order to provide an aberration corrected charged particle beam to be used for investigating the specimen 360. A charged particle beam 101 is generated. The charged particle beam 101 is deflected with a first magnetic deflection field, particularly a magnetic dipole field, by a first deflection angle, and the charged particle beam is deflected with a second magnetic deflection field, particularly a magnetic dipole field, by a second deflection angle. A beam direction reversal device 170 is excited to reflect the charged particle beam back towards the second magnetic deflection field, which deflects the reflected charged particle beam by a third deflection angle. The charged particle beam may then be deflected with a third magnetic deflection field by a fourth deflection angle. Then, at least one of a first electrostatic lens arranged in the charged particle beam propagation path between the first magnetic deflection field and the second magnetic deflection field and a second electrostatic lens arranged in the charged particle beam propagation path between the second magnetic deflection field and the third magnetic deflection field may be excited to compensate for a spatial dispersion of the charged particle beam.

In some embodiments, all four deflection angles are 45°, and the magnetic deflection fields have the same orientation with respect to the optical axis, so that the charged particle beam may exit the third magnetic deflection field along the direction of incidence A (straight vision system). In this case, when switching off the magnetic deflection fields $B_1$ and $B_2$, the charged particle beam may exit the beam deflector device without any deflection, while further propagating along the direction of incidence A, as is indicated in FIG. 5. When switching on the magnetic deflection fields $B_1$, $B_2$, and $B_3$, the charged particle beam may likewise exit the beam deflector device, while further propagating along the direction of incidence A, but having been deflected away from and back towards the direction of incidence A and as a compensated charged particle beam 102. Therefore, the beam deflector device shown in FIG. 5 may also be referred to as a beam switch.

As is shown in FIG. 6, the charged particle beam may be guided to further beam steering elements and/or beam shaping elements, e.g. through an objective lens 362. Then, a mirror corrector 171 of the beam direction reversal device 170 may be excited to at least partially compensate for spherical and/or chromatic aberrations caused by at least one beam steering element and/or beam shaping element in the charged beam propagation path, e.g. the objective lens 362 or a condenser lens system.

Figure 7:
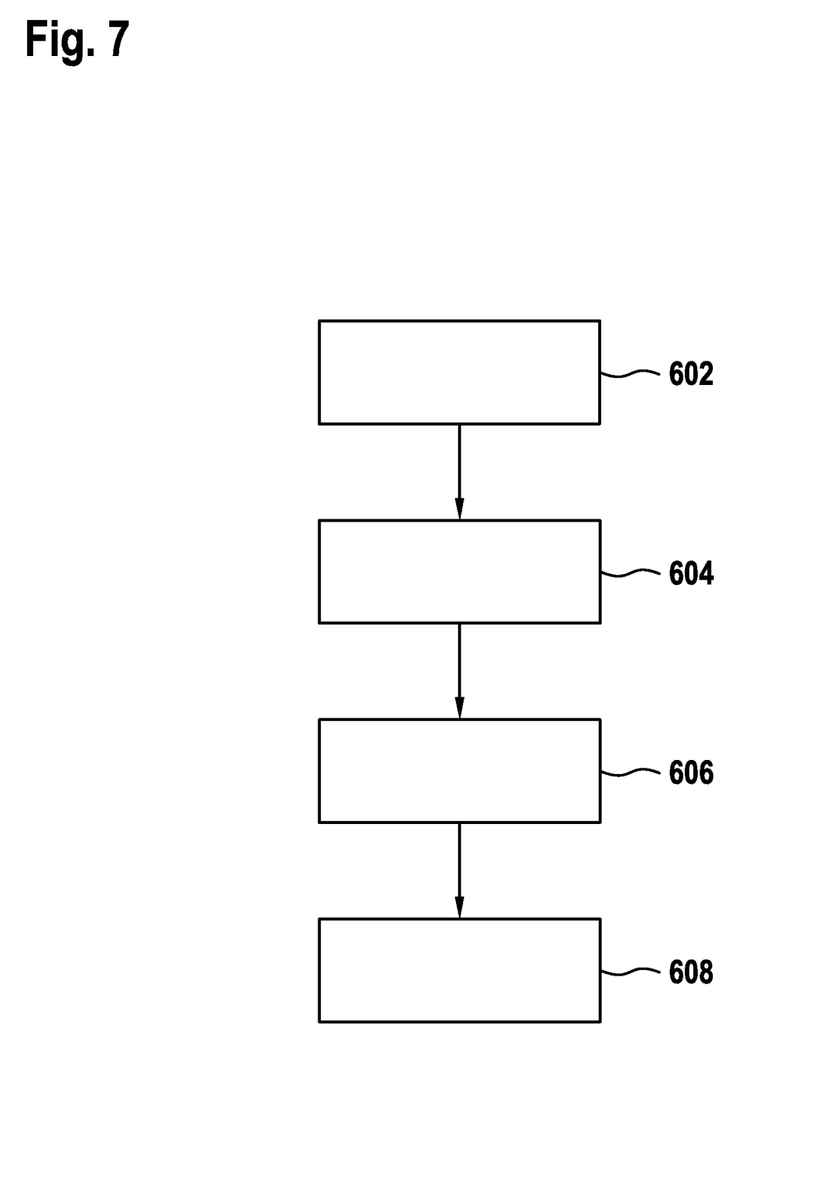
FIG. 7 shows a flowchart of a method of operating a charged particle beam device according to embodiments described herein.

FIG. 7 shows a flowchart of a method of operating a charged particle beam device according to embodiments described herein. In box 602, a charged particle beam, e.g. an electron beam, is generated. In box 604, the charged particle beam is deflected with a first magnetic deflection field by a first half of a deflection angle. The charged particle beam is focused to generate a beam crossover between the first magnetic deflection field and a second magnetic deflection field. Focusing can be achieved via a lens device, e.g. a condenser lens system, arranged upstream from the first magnetic deflection field and/or via the first magnetic deflection field itself, which may have a focusing effect on the charged particle beam. Then, in box 606, the charged particle beam is deflected with the second magnetic deflection field by a second half of the deflection angle. Afterwards, in box 608, an electrostatic lens arranged at a position of the beam crossover may be excited to at least partially compensate for a spatial dispersion of the charged particle beam.

Before exciting the electrostatic lens, the charged particle beam, the first magnetic deflection field, and/or the second magnetic deflection field may be aligned to (i) shift the crossover of the charged particle beam to a center position between the first magnetic deflection field and the second magnetic deflection field and (ii) to reduce or eliminate an astigmatism of the charged particle beam. After alignment, a cross-sectional shape of the charged particle beam downstream from the second magnetic deflection field should correspond to a cross-sectional shape of the charged particle beam upstream from the first magnetic deflection field, e.g. a round shape. Then, the electric field of the electrostatic lens may be adjusted to reduce or eliminate a spatial dispersion of the charged particle beam, which may be caused by the first magnetic deflection field and the second magnetic deflection field.

The dispersion-free beam deflector device according to embodiments herein is particularly beneficial for the following reasons:

- The beam crossover X is placed inside the electrostatic lens, which makes alignment easy, because an excitation of the electrostatic lens does not affect the alignment of other beam shaping optics. The only function of the electrostatic lens may be to cancel the dispersion of the beam deflector device.
- Allowing for a tilted edge of the pole pieces of the deflectors may mitigate the need for additional current or voltage sources that would otherwise be necessary to excite further magnetic or electric fields for astigmatism reduction.
- Particularly when used in an SEM device, two dispersion-free beam deflector devices with a deflection angle of 90°, respectively, may be combined to provide a straight-vision beam system.

While the foregoing is directed to embodiments of the invention, other and further embodiments of the invention may be devised without departing from the basic scope thereof, and the scope thereof is determined by the claims that follow.

The invention claimed is:

1. A charged particle beam device, comprising:
   a beam source for generating a charged particle beam;
   a lens device;

a beam deflector device for deflecting the charged particle beam with respect to a direction of incidence (A), comprising:
- a first deflector providing a first magnetic deflection field ($B_1$) for deflecting the charged particle beam by a first half of a deflection angle ($\alpha$);
- a second deflector providing a second magnetic deflection field ($B_2$) for deflecting the charged particle beam by a second half of the deflection angle ($\alpha$); and
- a rotation-free lens arranged between the first deflector and the second deflector for at least partially compensating for a beam dispersion introduced by at least one of the first deflector and the second deflector,
- wherein the lens device and the first deflector are configured for creating a crossover (X) of the charged particle beam at the position of the rotation-free lens.

2. The charged particle beam device according to claim 1, wherein the rotation-free lens is an electrostatic lens.

3. The charged particle beam device according to claim 1, wherein the rotation-free lens is arranged at a center position between the first deflector and the second deflector.

4. The charged particle beam device according to claim 1, wherein the first deflector and the second deflector are arranged symmetrically with respect to a first symmetry plane (E) intersecting the rotation-free lens.

5. The charged particle beam device according to claim 4, wherein a charged particle beam propagation path of the beam deflector device is symmetrical with respect to the first symmetry plane (E).

6. The charged particle beam device according to claim 5, wherein a cross-sectional profile of the charged particle beam is symmetrical with respect to the first symmetry plane (E) in every sectional plane perpendicular to the charged particle beam propagation path in the beam deflector device.

7. The charged particle beam device according to claim 5, wherein a cross-sectional energy distribution of the charged particle beam is symmetrical with respect to the first symmetry plane (E) in every sectional plane perpendicular to the charged particle beam propagation path in the beam deflector device.

8. The charged particle beam device according to claim 1, wherein at least one of a beam entrance edge and a beam exit edge of the first deflector is shaped for reducing an astigmatism of the charged particle beam.

9. The charged particle beam device according to claim 8, wherein the beam exit edge of the first deflector and a beam entrance edge of the second deflector are tilted by a tilting angle ($\epsilon$) with respect to a sectional plane perpendicular to a charged particle beam propagation path between the first deflector and the second deflector.

10. The charged particle beam device according to claim 9, wherein the tilting angle ($\epsilon$) is smaller than 80°.

11. The charged particle beam device according to claim 9, wherein the tilting angle ($\epsilon$) is larger than 5° and smaller than 45°.

12. The charged particle beam device according to claim 1, wherein at least one astigmatism reduction device providing an additional magnetic or electric quadrupole field for reducing an astigmatism of the charged particle beam is provided.

13. The charged particle beam device according to claim 1, wherein the deflection angle ($\alpha$) is an angle between 20° and 110°.

14. The charged particle beam device according to claim 1, wherein the deflection angle ($\alpha$) is 90°.

15. The charged particle beam device according to claim 1, comprising a beam direction reversal device for sending back at least part of the charged particle beam towards the second deflector as a compensated charged particle beam, wherein the second deflector is configured for deflecting the compensated charged particle beam by a second deflection angle.

16. The charged particle beam device according to claim 15, wherein the beam direction reversal device comprises a mirror corrector for providing compensation of spherical and/or chromatic aberrations of the charged particle beam.

17. The charged particle beam device according to claim 15, further comprising:
- a third deflector providing a third magnetic deflection field ($B_3$) for deflecting the compensated charged particle beam by a third deflection angle, the third deflection angle corresponding to the second deflection angle; and
- a second rotation-free lens arranged in the center between the second deflector and the third deflector for at least partially compensating for a dispersion introduced by at least one of the second deflector and the third deflector, wherein the beam direction reversal device is configured for creating a second crossover of the charged particle beam at the position of the second rotation-free lens.

18. A beam deflector device for a charged particle beam device for deflecting a charged particle beam with respect to a direction of incidence (A), comprising:
- a first deflector providing a first magnetic deflection field ($B_1$) for deflecting the charged particle beam by a first half of a deflection angle ($\alpha$);
- a second deflector providing a second magnetic deflection field ($B_2$) for deflecting the charged particle beam by a second half of the deflection angle ($\alpha$); and
- a rotation-free lens to be arranged at a position of a crossover (X) of the charged particle beam between the first deflector and the second deflector for at least partially compensating for a beam dispersion introduced by at least one of the first deflector and the second deflector.

19. A method of operating a charged particle beam device, the method comprising:
- generating a charged particle beam;
- deflecting the charged particle beam with a first magnetic deflection field by a first half of a deflection angle;
- deflecting the charged particle beam with a second magnetic deflection field by a second half of a deflection angle;
- focusing the charged particle beam to generate a beam crossover between the first magnetic deflection field and the second magnetic deflection field; and
- exciting a rotation-free lens arranged at a position of the beam crossover to at least partially compensate for a dispersion of the charged particle beam.

20. A method of aligning a beam deflector device, the method comprising:
- focusing a charged particle beam to generate a beam crossover at a first distance of a switched-off first magnetic deflection field;
- switching on the first magnetic deflection field to deflect the charged particle beam by a first half of a deflection angle and to shift the beam crossover to a second distance of the first magnetic deflection field;
- switching on a second magnetic deflection field to deflect the charged particle beam by a second half of the deflection angle;
- exciting a rotation-free lens arranged at a position of the beam crossover to at least partially compensate for a dispersion of the charged particle beam.

* * * * *